United States Patent
Yassine

(10) Patent No.: US 10,847,241 B2
(45) Date of Patent: Nov. 24, 2020

(54) JOINT SOFT BOUNDARIES AND LLRS UPDATE FOR FLASH MEMORY

(71) Applicants: Kabushiki Kaisha Toshiba, Minato-ku (JP); Toshiba Memory Corporation, Minato-ku (JP)

(72) Inventor: Hachem Yassine, Bristol (GB)

(73) Assignees: Kabushiki Kaisha Toshiba, Minato-ku (JP); Toshiba Memory Corporation, Minato-ku (JP)

(*) Notice: Subject to any disclaimer, the term of this patent is extended or adjusted under 35 U.S.C. 154(b) by 0 days.

(21) Appl. No.: 16/299,179

(22) Filed: Mar. 12, 2019

(65) Prior Publication Data

US 2020/0294611 A1    Sep. 17, 2020

(51) Int. Cl.
| | | |
|---|---|---|
| *G11C 29/02* | (2006.01) | |
| *G06F 11/10* | (2006.01) | |
| *G06F 17/11* | (2006.01) | |
| *G06F 3/06* | (2006.01) | |

(52) U.S. Cl.
CPC .......... *G11C 29/024* (2013.01); *G06F 3/0616* (2013.01); *G06F 3/0634* (2013.01); *G06F 3/0679* (2013.01); *G06F 11/1068* (2013.01); *G06F 17/11* (2013.01); *G11C 29/021* (2013.01)

(58) Field of Classification Search
CPC ... G11C 29/024; G11C 29/021; G06F 3/0616; G06F 11/1068; G06F 3/0634; G06F 3/0679; G06F 17/11
See application file for complete search history.

(56) References Cited

U.S. PATENT DOCUMENTS

| | | | | |
|---|---|---|---|---|
| 8,493,791 B2* | 7/2013 | Karakulak | ......... | G11C 16/3431 365/185.18 |
| 2012/0297273 A1* | 11/2012 | Sakaue | ............... | G06F 11/1048 714/773 |
| 2013/0111292 A1* | 5/2013 | Obata | ................ | H03M 13/1128 714/752 |
| 2014/0289450 A1* | 9/2014 | Wu | ..................... | G06F 11/1064 711/103 |
| 2016/0266969 A1* | 9/2016 | Jeon | ..................... | G06F 11/1068 |
| 2016/0277041 A1 | 9/2016 | Zhang et al. | | |

OTHER PUBLICATIONS

J. Peng, Q. Wang, X. Fu and Z. Huo, "Dynamic LLR scheme based on EM algorithm for LDPC decoding in NAND flash memory", IEICE Electron. Exp., vol. 14, No. 18, pp. 1-8, Sep. 2017. (Year: 2017).*

Brian M. Kurkoski et al., "Quantization of Binary-Input Discrete Memoryless Channels", IEEE Transactions on Information Theory, 2014, vol. 60, No. 8, pp. 4544-4552.

Eran Sharon et al. "Dynamic Memory Error Model Estimation for Read and ECC Adaptations", Nonvolatile Memory Workshop, 2017, pp. 1-2.

* cited by examiner

*Primary Examiner* — Jerome Leboeuf
(74) *Attorney, Agent, or Firm* — Oblon, McClelland, Maier & Neustadt, L.L.P.

(57) ABSTRACT

A method performed in a computing device. The computing device is configured to store data and retrieve stored data from storage. The computing device further stores parameters for use in soft decoding stored data. The method comprises retrieving data from storage using soft decoding based on the stored soft decoding parameters, using retrieved, soft decoded data to estimate updates of one or more of the parameters for soft decoding and storing the updates.

13 Claims, 7 Drawing Sheets

JOINT SOFT BOUNDARIES AND LLRS UPDATE FOR FLASH MEMORY

FIELD

Embodiments described herein relate generally to a method of soft decoding of stored data and in particular to a method of maintaining up to date soft decoding parameters.

BACKGROUND

Data stored in flash memory can be retrieved by comparing the threshold voltage of a cell against a number of read references to quantize it and identify the bin to which each cell belongs. A larger number of reads provides a better precision on what the unquantised output is, but incurs read latency. To avoid undue read latency it is desirable to have just enough read precision to enable error correction methods that do not or to a lesser extent contribute to read latency.

Soft decoding methods may be used to further improve the precision of the data read. Some soft decoding methods rely on knowledge of the log-likelihood ratio (LLR) of each received output, i.e., log of the ratio between the probability that a '0' is stored and the probability that a '1' is stored, given the observed output bin. The LLRs of a group of cells (e.g. a logical page) can then be fed to an ECC decoder to correct errors in the data. The performance of the decoder highly depends on the precision of the quantiser, and the accuracy of the LLR of each bin. Flash memory degrades with usage, making it difficult to determine these parameters reliably.

In the following, embodiments will be described with reference to the drawings in which.

DETAILED DESCRIPTION

Figure 1:
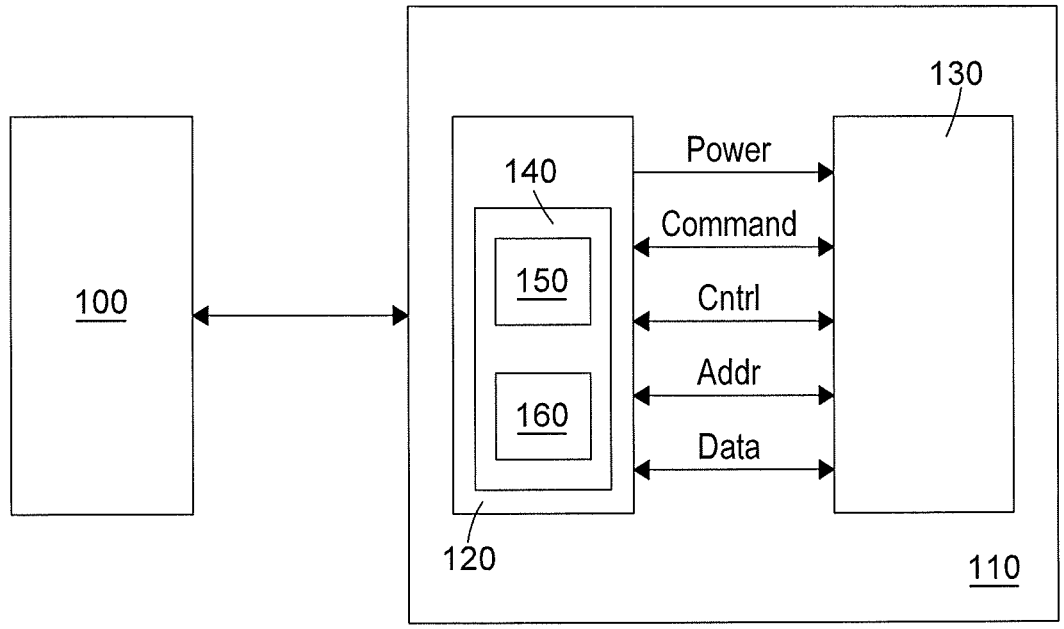
FIG. 1 shows a system that comprises a computing device and a non-volatile flash storage memory.

According to an embodiment there is provided a method performed in a computing device. The computing device is configured to store data and retrieve stored data from storage. The computing device further stores parameters for use in soft decoding stored data. The method comprises retrieving data from storage using soft decoding based on said stored soft decoding parameters, using retrieved, soft decoded data to estimate updates of one or more of the parameters for soft decoding and storing said updates.

In an embodiment, once updates are stored, a normal operating mode in which the updated parameters are used for soft decoding stored data is switched to.

In an embodiment the method further comprises outputting the retrieved data.

The parameter may be one or more of a log likelihood ratio (LLR) associated with a quantisation bin used in retrieving and/or soft decoding stored data and a transition probability associated with a quantisation bin.

In an embodiment the computing device stores said parameters or a version of said parameters in a manner that enables the device to perform data retrieval and soft decoding for precise quantisation bins that allow more detailed quantisation than during a normal operating mode. The method, to update said parameters, retrieves said data using said precise quantisation bins and updates said parameters associated with said precise quantisation bins.

In an embodiment the method further comprises determining, based on said parameters associated with said precise quantisation bins, parameters for quantisation bins used during said normal operating mode.

In an embodiment the method further comprises determining said parameters for said precise quantisation bins during a set up procedure comprising storing known data, retrieving the stored data using the precise quantisation bins and determining said parameters for the precise quantisation bins, using knowledge of the originally stored data and the retrieved data.

The quantisation bins may be optimised based on said knowledge of the originally stored data and the retrieved data.

According to another embodiment there is provided a non-volatile storage medium storing code for execution by a processor, the code configured to, when executed, cause the processor to perform the method of Claim 1.

According to another embodiment there is provided a computing device comprising memory for storing data, parameters for use in soft decoding stored data and program instructions, read circuitry for retrieving stored data and a processor, the program instructions are configured to cause the processor to cause the read circuitry to retrieving data from said memory, to soft decode said retrieved data based on said stored soft decoding parameters, to use said retrieved, soft decoded data to estimate updates of one or more of the parameters for soft decoding and to store said updates in said memory.

In an embodiment the device stores the data, parameters for use in soft decoding stored data and program instructions in one memory. In a different embodiment the data, parameters for use in soft decoding stored data and program instructions are stored in different memories.

Error correcting codes (ECCs) are used to maintain the reliability of digitally stored/communicated data. ECCs can correct more errors by having a high-precision quantization of the output of the data storage channel, but this incurs a latency overhead that can be unacceptable for certain applications, e.g., storage. Furthermore, the accurate reliability metric of each quantization level, i.e., its log-likelihood ratio (LLR) is needed for good ECC performance. However, for some applications, such knowledge is very hard to get as the channel varies. In particular, some channels become less reliable with usage, e.g., storage. As this happen, the quantizer becomes sub-optimal and the LLRs become inaccurate, and both require updating to make the most out of the limited number of allowed quantization levels.

Embodiments provide an algorithm that regularly updates the LLRs of the quantization bins. The algorithm can be applied in a genie-aided mode where the original inputs corresponding to each sensed output are known. However, since in practice this is hard to be satisfied, a blind technique using the output of the ECC decoder as a feedback instead of the "true" inputs to inform the LLRs is proposed.

FIG. 1 shows a system that comprises a computing device 100 and non-volatile flash storage memory 110. The computing device may be a mobile computing device, such as a mobile phone, tablet computer, laptop, camera or any other type of mobile computing device. Alternatively the computing device 100 may be stationary, such as a desktop computer or indeed part of a stationary server or part of a storage bank, such as part of a RAID solution.

The non-volatile flash storage memory 110 may take any form of non-volatile storage device comprising flash memory. The non-volatile flash storage memory 110 may, for example, be a "thumb drive", a solid-state drive (SSD), a memory card, etc.

The computing device 100 and the non-volatile flash storage memory 110 are in communicative connection with each other in a manner that allows the computing device 100 to transmit data and commands indicating the processing the data is to be subjected to by the non-volatile flash storage memory 110 to the non-volatile flash storage memory 110 and that allows the non-volatile flash storage memory 110 return data retrieved from memory to the computing device 100. The computing device 100 may also provide power to the non-volatile flash storage memory 110. A number of interfaces that allow communication between a computing device 100 and a non-volatile flash storage memory 110 are known. The exact nature of the interface is not important. Exemplary interfaces include the USB interface, SD, microSD, xD, Compactflash, MMC, to name but a few.

The non-volatile flash storage memory 110 comprises a memory controller 120 and non-volatile flash memory 130. The memory controller 120 interfaces with the computing device 100 as well as with the flash memory 130. The memory controller 120 provides power to the flash memory 130 and is moreover connected to the flash memory 130 via command, control, address and data lines. The memory controller 120 may control all of the operations flash memory 130.

Figure 2:
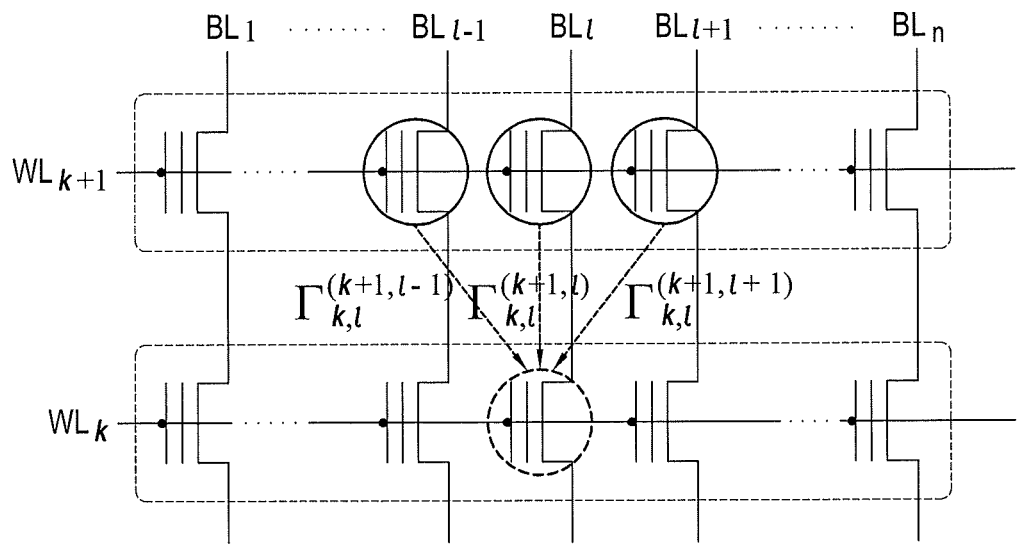
FIG. 2 shows an architecture of memory cells within a flash array.

As shown in FIG. 2, memory cells in NAND flash memory consist of field effect transistors that comprise a floating gate interposed between the FET's gate and channel. NAND flash memory cells are organised into multiple blocks. Memory cells within each block are arranged horizontally along word-lines (for example around 32-64 word lines per block; in FIG. 2 two word lines, $WL_{k+1}$ and $WL_k$ are shown) that connect the gates of horizontally adjacent FETs, and vertically along (often thousands of) bit-lines ($BL_1$ to $BL_n$ in FIG. 2), connecting drains and sources of vertically adjacent FETs. The control gates of all the cells along a word-line are connected to the address bus while the drains of the cells along a bit-line are connected to the data bus. The unit for read/write operations is the word-line, whereas erasure is applied block-wise.

To determine the storage state of a memory cell a bias voltage is applied to the word line connected to the memory cell in question and a separate bias voltage is applied across the memory cell's channel. The gate voltage applied to all other memory cells that are connected to the memory cells that is to be read is such that the other memory cells are fully conducting so that the bias voltage applied along the bitine is applied, to the largest extent possible, across the channel of the memory cell to be read.

Figure 3A:
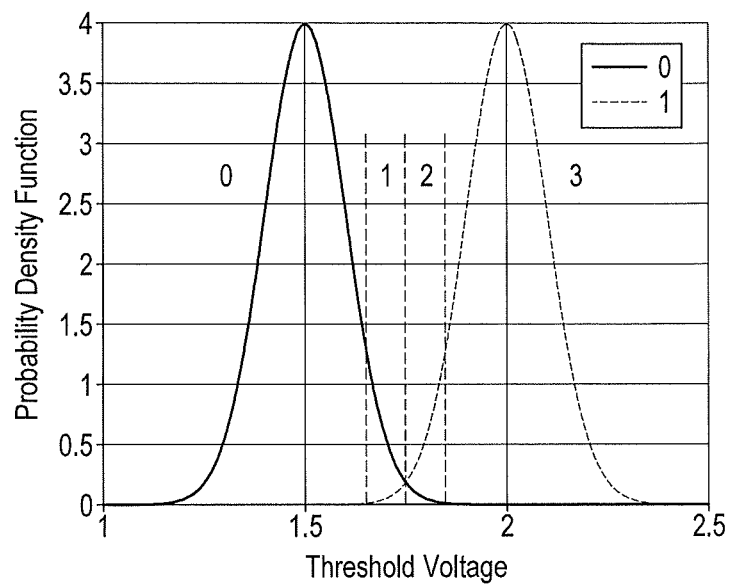
FIG. 3A shows an example of threshold voltage distributions of a memory cell that can store one bit of data (SLC)

FIG. 3A shows the potential storage states of a memory cell can store a single bit. The abscissa represents the threshold voltage applied to the gate of the memory cell. If a threshold voltage falling between the two storage states (the left-most storage state is the erased state of the memory cell in may be associated with a logical "0" while the right-most storage state indicated by "1" is the program state of the memory cell and may be associated with a logical "0", although the mapping of storage state to logical information can be reversed) is applied to the gate then the memory cell is conducting if the floating gate stores charges falling within the boundary of the right-most/"0" storage state and non-conducting if the floating gate stores charges falling within the boundary of the left-most/"1" storage state. Thus, by detecting the current flowing through the memory cell the storage state of the memory cell can be determined. The two distributions shown in FIG. 3A are distributions of a plurality of memory cells within the two storage states.

The conductivity of the channel of the memory cell to be read is intended to be influenced solely by the amount of charge stored on the memory cell's floating gate and by the bias voltage (indicated by the vertical dashed line between numbers 1 and 2 in FIG. 3A) applied to the gate of the memory cell. The source-drain current that can be sensed as flowing through the channel of/along the bit line connected to the memory cell allows concluding whether the amount of charge stored by the memory cell is above or below an amount required for rendering the channel of the memory cell conductive for a given gate bias voltage.

NAND flash memory cells are subject to various types of impairments that affect its performance, such as inaccurate programming, retention noise, random telegraph noise and more importantly inter-cell interference (ICI). Electric fields created by charges stored on the floating gate of one memory cell can influence the conductivity of the channel of an adjacent memory cell, thereby interfering with and potentially falsifying perceived memory cell storage state. This is illustrated by the overlap in the storage states shown in FIG. 3A. It will be appreciated that, even if the threshold voltage corresponding to the dashed line between numbers 1 and 2 in FIG. 3A is chosen it is still possible for programmed memory cells that happen to fall within the leftmost part of the charge distribution on the right-hand side to not be able to cause the memory cell to conduct. These memory cells are then incorrectly interpreted as relating to the left-hand charge distribution. Conversely it is also possible for an erased memory cells that happen to fall within the rightmost part of the left-hand charge distribution to cause the memory cell to conduct during a read operation so that these memory cells are being incorrectly interpreted as relating to the right-hand charge distribution.

Figure 3B:
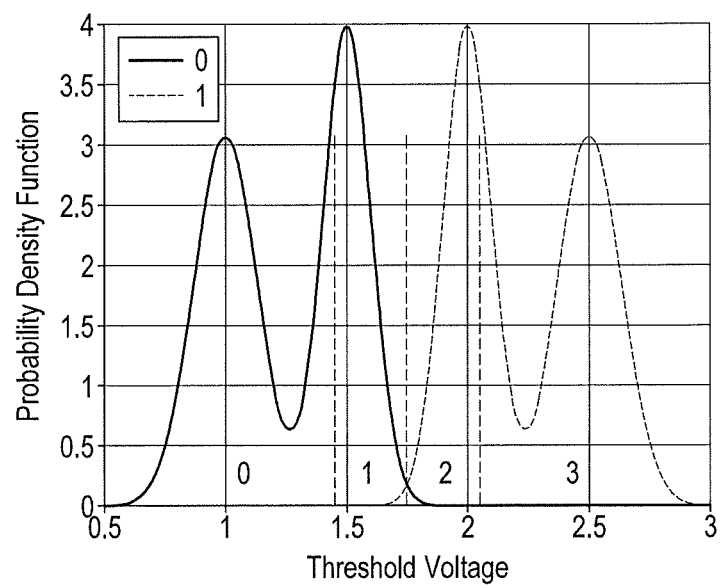
FIG. 3B shows an example of threshold voltage distributions of a memory cell that can store two bits of data (MLC), wherein the most significant bit is detectable by determining if a cell has been programmed to one of the two left-most or one of the two right-most charge distributions.

FIG. 3B shows the charge distributions to which a memory cell can be programmed if the memory cell is to store two bits of data. The most significant bit of these two bits is encoded by programming the memory cell to one of the two left-most storage states (which, in this example, is interpreted as indicating the storage of a logical "0") or to one of the two right-most storage states (which, in this example, is interpreted as indicating the storage of a logical "1"). In an ideally performing memory cell in which the two middle storage states do not overlap these most significant bit can be decoded in a single read operation in which the conductivity of the memory cell is measured when a gate threshold voltage corresponding to the central vertical line shown in FIG. 3B is applied. More sophisticated decoding methods need to be employed in the more commonplace situation shown in FIG. 3B in which the central charge distributions overlap.

Figure 3C:
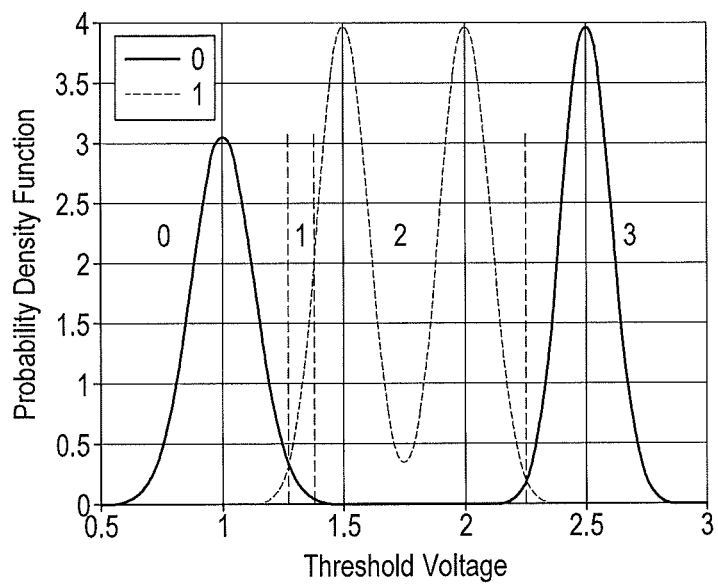
FIG. 3C shows an example of threshold voltage distributions of a memory cell that can store two bits of data (MLC), wherein the least significant bit is detectable by determining if a cell has been programmed to one of the two central charge distributions or to the left-most or right-most storage distribution.

FIG. 3C shows the charge distributions for the memory cell discussed with reference to FIG. 3B but focussing on decoding of the least significant bit. The least significant bit is stored in the memory cell by programming the memory cell to one of the left-most and right-most memory states to store a logical "0" or to one of the two central charge distributions to store a logical "1". To decode an ideal memory cell in which the two left-most charge distribution states do not overlap and in which the two right-most charge distribution states do not overlap two read operations, one at each of the threshold voltage levels respectively falling between the two left-most and the two right-most charge distributions, are sufficient to allow determining if a memory cell in question has been programmed to the two central charge distributions (which, in this example, corresponds to a logical "1") or to left-most or right-most charge distribution (which, in this example, corresponds to a logical "0"). More sophisticated decoding methods need to be employed in the more commonplace situation shown in FIG. 3C in which adjacent charge distributions overlap.

As flash memory architectures continue to be miniaturised the parasitic effects between adjacent cells becomes more pronounced, thereby increasing ICI/overlap between adjacent storage distributions.

One way of mitigating the increasing ICI effect is to employ soft-decision error correction codes (ECCs). Towards this purpose, a flash memory controller may start by comparing the threshold voltage against the hard decision boundaries. If sensing of the storage states of memory cells using hard decision boundaries soft decoding may instead be used. Error correction codes to which soft decoding can be applied include a LDPC (low-density parity check) code, a BCH code, a turbo code, an RS (Reed-Solomon code), a convolution code, an RSC (Recursive Systematic Code), or coded modulation such as TCM (Trellis-Coded Modulation), BCM (Block Coded Modulation), and so on. Soft decoding algorithms that can be used include, amongst others, mini-sum algorithms and Viterbi decoding. For soft decoders to work in the best possible way they require knowledge of the reliability of (e.g., log-likelihood ratios (LLRs)) of the read information to be fed to the iterative decoder. As the channel model is not precisely known, it is desirable to have a simple and dynamic LLR estimation algorithm instead of relying on precomputed lookup table that may undermine the performance the soft detection method.

Some flash memory arrays may be configured to perform an initial 'hard detection' routine in an attempt to determine the storage states of a group of memory cell by simply distinguishing between the stored states using the above described reading process. Any errors encountered are corrected using error correction codes that have originally been stored with the data that is to be read. In such a hard detection routine the threshold voltage used for distinguishing between two storage states may be changed in subsequent read attempts until a threshold voltage that minimises the total number of errors in the read group of cells is minimised. FIG. 3B illustrates this. In a first read operation threshold voltage indicated in FIG. 3A by the dashed line between the numbers 1 and 2 may be used. The flash memory may be configured to attempt to perform additional readings of the storage states of the group of memory cells using other threshold voltages that are higher or lower than the initially used threshold voltage. The number of errors detected for the group of memory cells using the various read voltages may be compared and the read result that delivers the fewest errors may be chosen for further processing. If the number of errors is low enough to allow the error correction codes stored with the read data to correct these errors then such correction takes place and no further efforts have to be expended on correcting the data.

It will be appreciated that as a read threshold voltage is moved towards zero volt, the number of memory cells that are detected as being in the left-most storage state in FIG. 3A decreases and the number of memory cells that are detected as being in the right-most storage state in FIG. 3A increases.

In FIG. 3A three read threshold voltages (indicated by the three dashed lines) are used to segment the threshold voltage range into four bins/quantization levels numbered from 0 to 3. Applying K read references results in K+1 bins numbered 0 to K. K can be chosen to be small to keep the number of attempts of reading memory cells small, thereby minimising latency, albeit at the expense of a low precision. The actual value stored in a cell are in the following denoted by $x \in \{0,1\}$. The bins in which the cell is read (output) is in the following denoted by $y \in \{0, \ldots, K\}$. The probability that a "1" is stored in the cell given that it was read in the $r^{th}$ bin can be expressed as:

$$p_{X|Y}(1|r) \text{ for } r \in \{0, \ldots, K\} \quad (1)$$

The log likelihood ratio (LLR) of the $r^{th}$ bin is defined as:

$$L_r = \log \frac{1 - p_{X|Y}(1|r)}{p_{X|Y}(1|r)} \quad (2)$$

If the outputs $y=(y_1, \ldots, y_n)$ of n cells and their corresponding inputs $x=(x_1, \ldots, x_n)$ are known in a genie-aided case the posterior probability that the cell stores 1 given that it is read in interval r, i.e., $P\_\{X|Y\}(1|r)$ is estimated by counting the number cells read in the $r^{th}$ bin and whose input is 1 and dividing it by the number of cells whose output is r, i.e.:

$$p_{X|Y}(1|r) = \frac{\sum_{i=1}^{n} x_i \delta(y_i - r)}{\sum_{i=1}^{n} \delta(y_i - r)} \quad (3)$$

where $\delta(z)=1$ for $z=0$ and zero otherwise. In one embodiment the K optimal read threshold voltages are determined in the manner disclosed in Kurkoski, Brian M., and Hideki Yagi. "Quantization of binary-input discrete memoryless channels." *IEEE Transactions on Information Theory* 60.8 (2014): 4544-4552, the entirety of which is incorporated herein by reference. The assumption that the inputs are known is common in state-of the art schemes available in literature. The present disclosure deals with situations where this is not the case.

In embodiments the input x is not available and only the outputs y are available. It is, however, known that the input x is an ECC codeword. Hence, instead of knowing in advance the true input data, we use the best estimate of the input data that can be obtained by feeding back the output of the decoder each time a decode operation is done. In an embodiment 1. After a page is read, the most recent LLRs are used to initiate the soft-decoder (e.g., belief propagation). The output of the decoder will be the new belief about the value of the inputs of each cell, i.e., $p_{X_i|Y}(x|y)$ for $i \in \{1, \ldots, n\}$.
2. The expected values of the inputs (equivalent to the posterior probability of '1') can then be used instead of the real value of $x_i$ (which is unknown) to update the posterior in equation (3) above:

$$p_{X|Y}(1|r) = \frac{\sum_{i=1}^{n} p_{X_i|Y}(1|y)\delta(y_i - r)}{\sum_{i=1}^{n} \delta(y_i - r)}$$

3. Once the new posterior distribution (for each r) is updated, the LLRs can also be updated using equation (2) above.
4. The updated LLRs can be used again to initiate the decoder in order to decode the same read cells a second time. Upon the end of decoding, the same process of updating the posterior and LLRs are repeated.
5. The iteration between decoding and updating the LLRs is done until the LLRs no longer change or a maximum number of iterations is reached.
6. The new LLRs are then used until the next time the update process is triggered.

Figure 4:
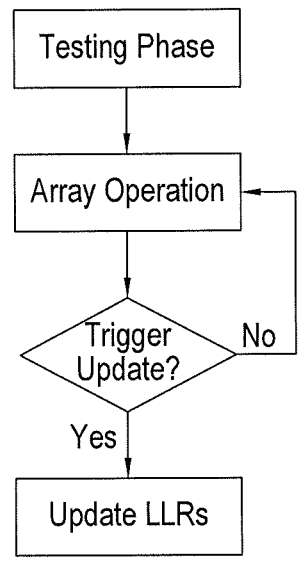
FIG. 4 shows method steps performed in an embodiment.
Figure 5:
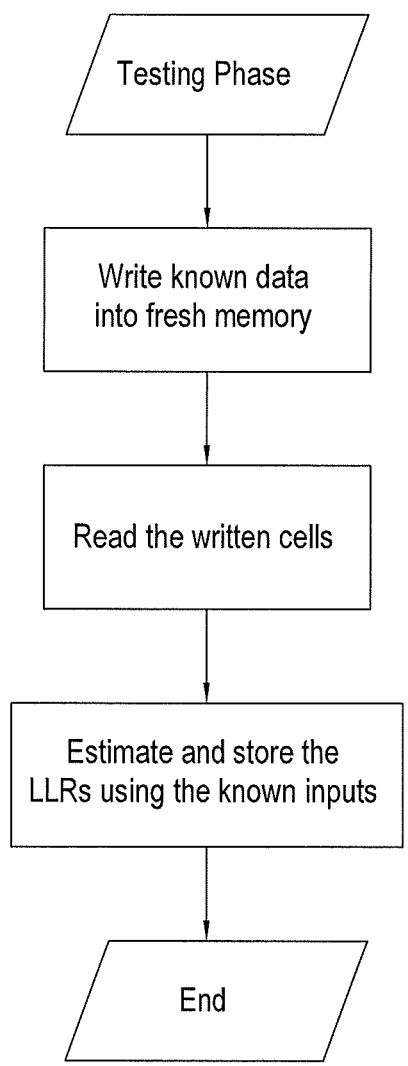
FIG. 5 shows method steps performed during testing of a memory array.

A summary of an embodiment is illustrated in FIG. 4. Steps performed in a testing phase before the memory array is being shipped are shown in FIG. 5. In the testing phase shown in FIG. 5 a large number of cells are programmed and the stored data are read. In this manner the input and output of this first programming operation is known. Based on these inputs and outputs the LLRs for the memory can be determined using equations (3) an (2) and stored for future use. Flash devices treated in this manner are fully characterized, i.e., the optimal LLRs are known. The steps shown in FIG. 5 can be performed during the lab testing phase by having access to a dataset of the inputs and their corresponding outputs. This will allow the update process to have initial LLRs to use.

In MLC devices, each page can be handled independently, this is convenient for the proposed scheme and the considered inputs x could be any page (LSB, MSB, etc). The only difference in the characterisation of LSB and MSB of an MLC device is the underlying distribution of the threshold voltage. No knowledge of this threshold voltage distribution is required in the embodiments.

During use of the memory array (FIG. 4), the most recently stored LLRs are used for soft-decoding the read data, if the data cannot be read using hard decoding only. As memory arrays degrade with use it is important that, from time to time, the stored LLR values are updated. The process checks if a trigger condition (for example reaching a predetermined number of program/erase cycles, decoding failure or reaching a number of estimated errors that exceeds a predetermined threshold) for such an update is fulfilled and, if so, deviates from the normal read/write array operation to update LLRs. The trigger conditions include one or more of, a predetermined threshold number of program and erase cycles being reached, the number of read errors exceeding a predetermined error threshold, etc.

To update the LLRs, a page is read in a standard read operation and decoded using the stored LLRs. The process can use a single ECC codeword to adapt the parameters and does not require reading the whole block. The LLRs are then re-calculated in the manner discussed above and stored instead of the previously stored LLRs. During subsequent normal read and write operation of the array the newly stored LLRs are used for soft-decoding. As blocks of memory in a memory array can age at different speeds LLRs can differ between blocks. In an embodiment LLRs are stored and updated on a per-block basis. It is known to operate memory arrays so that the blocks wear more consistently than they would normally. In an embodiment LLRs are computed so that they are useable for block that have the same "age" or that have undergone similar numbers of program/erase cycles.

The coded performance of the MSB page of an MLC device using a rate 0.89 LDPC code was simulated to illustrate the performance of the proposed scheme. The output is quantized using three read references (K=3), i.e., 4 bins. The simulation starts at 15000 PE cycles, at which point it is assumes that access to the inputs and outputs of a large number of cells is available. It is therefore assumed that the optimal read references as well as the optimal LLRs are initially known. The read threshold voltages are fixed throughout the simulations and the results are calculated when:
1. The LLRs are kept fixed as they were at 15000 P/E cycles for the remaining of the lifetime of the device.
2. The LLRs are updated every 1000 P/E cycles using the Genie aided approach.
3. The LLRs are updated every 1000 P/E cycles using the blind approach we propose.

Figure 7:
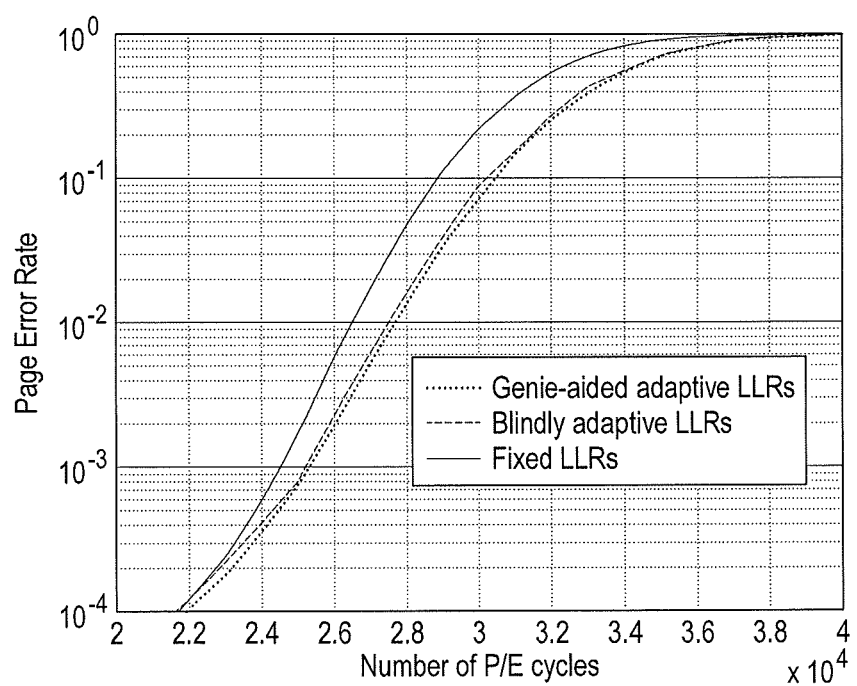
FIG. 7 shows simulated results of the read errors performance of different soft-decoding methods.

The coded BER performance is shown in FIG. 7. From this figure it is clear that the performance when the LLRs are regularly updated improves compared to when they are fixed. Furthermore, the blind approach disclosed herein has a performance close to that of the genie-aided one.

The method disclosed herein can be used along with adaptive read threshold reference voltages and not only fixed references. As the devices degrades, the references become sub-optimal and have to be updated in order to keep the error rate low. In the following we describe how our method can be combined with the method disclosed by Kurkoski, Brian M., and Hideki Yagi. "Quantization of binary-input discrete memoryless channels." *IEEE Transactions on Information Theory* 60.8 (2014): 4544-4552 to estimate the optimal read references. The corresponding flowchart is given in FIG. 6.
1. In the testing phase (i.e. before the device is shipped):
   a. A large number of cell with known inputs are read with a large number of references K'<<K (high precision quantization).
   b. The posterior and LLRs of the resulting bins are obtained similarly to when the precision is low, as discussed above, that is by using equations (3) and (2) above.
   c. The optimal K references are computed according to the scheme disclosed by Kurkoski et. al. Kurkoski selects K read references from the K' candidates by finding groups of bins and combining each group into a larger bin using dynamic programming, such that the mutual information between the input and output is maximized.
   d. The low-precision posteriors and LLRs are computed and used until the next time an updated is triggered.
   e. The high precision LLRs are stored to be used when the references are to be updated, as discussed in further detail below.

2. During normal read/write operation, reading and decoding is always done using the most current low-precision references and LLRs.
3. When an event triggers the update process, e.g., number of PE cycles reached, number of errors exceeds a threshold or another metric, the following steps are performed (FIG. 6):
   a. High precision sensing (i.e. sensing with a number of threshold voltages that exceeds the number of threshold voltages used for sending during a normal operating mode; K'<<K may be used as was the case during initial calibration) is performed
   b. Decoding of the high-precision output using the most current high-precision LLRs (i.e. the high precision LLRs stored during the testing phase or their replacements determined and stored during an earlier iteration of the update process)
   c. Update the high-precision posterior and LLRs in the manner described above, that is by using equations (3) and (2) above
   d. Iterate steps b) and c) until the high-precision posterior no longer change or a predetermined maximum number of iterations is reached.
   e. Store the new high-precision posteriors for the next time update is triggered.
   f. Apply the quantization disclosed by Kurkoski et. al. to update the references using the new high-precision posterior.
   g. Obtain the corresponding low-precision LLRs and use them for normal array operation.

Figure 6:
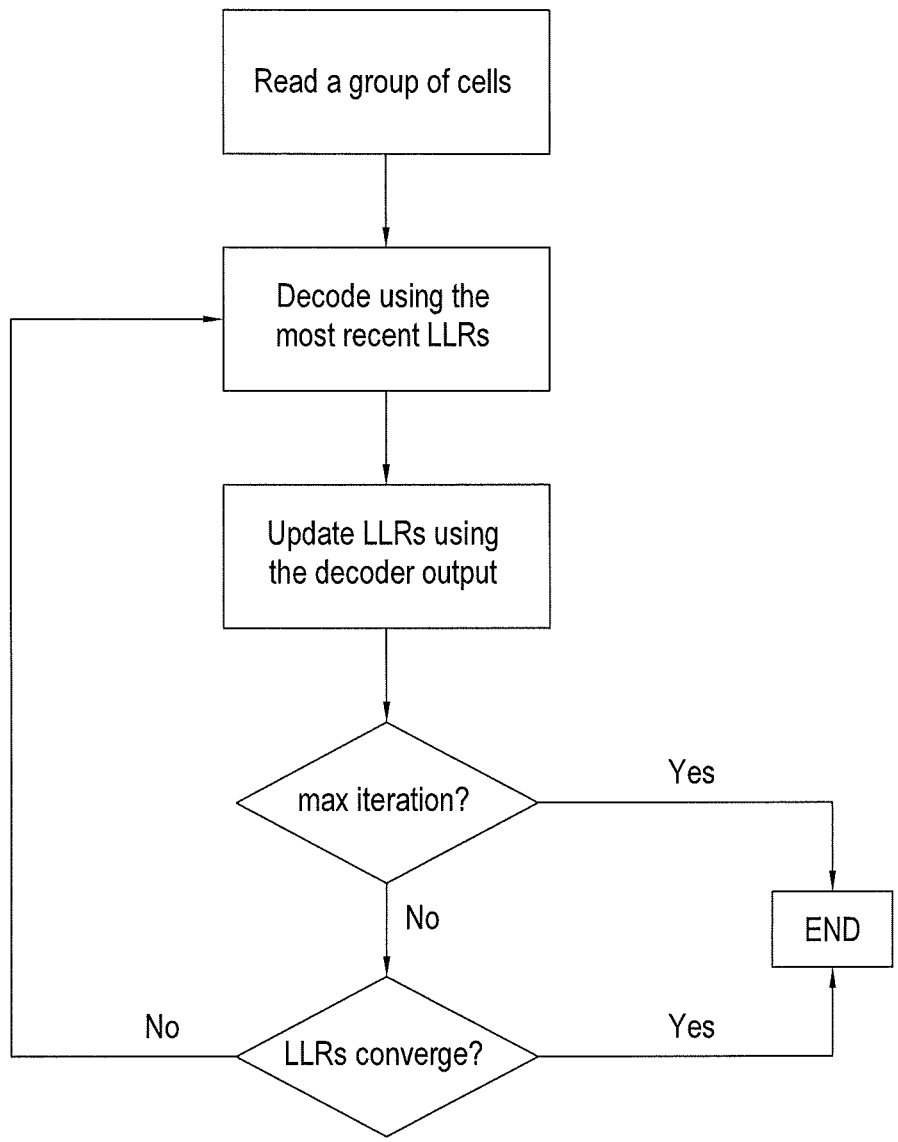
FIG. 6 shows method steps performed when updating stored LLR values.
Figure 8:
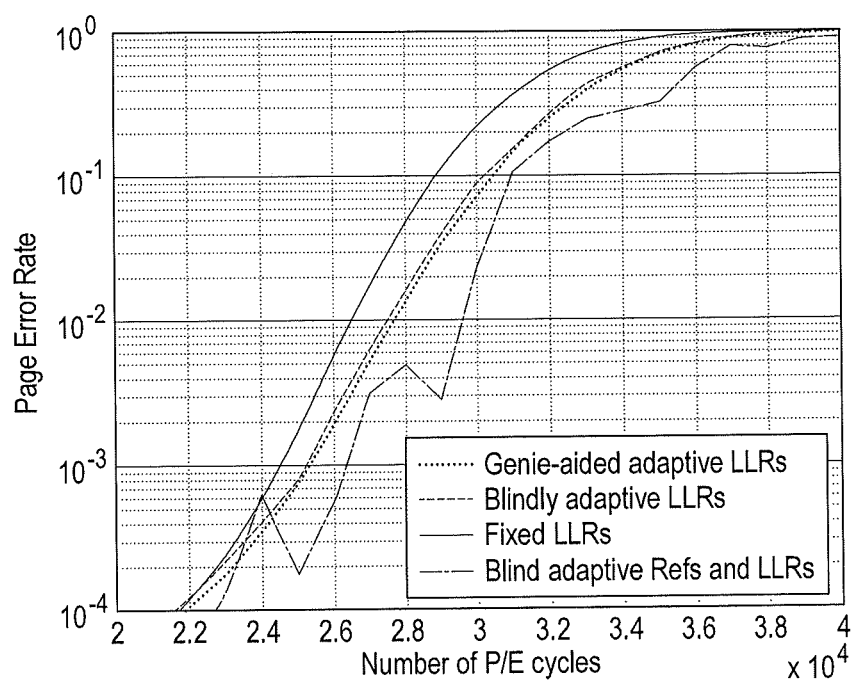
FIG. 8 shows further simulated results of the read errors performance of different soft-decoding methods.

The results achieved using the method illustrated in FIG. 6 are shown in FIG. 8, where updating the references improves the performance. However, the curves are not smooth because the reference estimate is based on a single codeword.

Whilst certain embodiments have been described, these embodiments have been presented by way of example only, and are not intended to limit the scope of the inventions. Indeed, the novel devices, and methods described herein may be embodied in a variety of other forms; furthermore, various omissions, substitutions and changes in the form of the devices, methods and products described herein may be made without departing from the spirit of the inventions. The accompanying claims and their equivalents are intended to cover such forms or modifications as would fall within the scope and spirit of the inventions.

The invention claimed is:

1. A method at least partially performed by electronic circuitry coupled to a storage, the method comprising:
   performing a setup procedure including storing a first log likelihood ratio (LLR) set associated with a first number of quantisation bins; and
   performing an update procedure including:
   retrieving first data stored in the storage using soft decoding based on the first LLR set;
   determining a first posterior probability set associated with the first number of quantisation bins based on the retrieved first data;
   updating the first LLR set to a second LLR set associated with the first number of quantisation bins based on the first posterior probability set;
   determining a second posterior probability set associated with a second number of quantisation bins based on the first posterior probability set the second number being less than the first number;
   determining a third LLR set associated with the second number of quantisation bins based on the second posterior probability set; and
   storing the second LLR set and the third LLR set.

2. The method as claimed in claim 1, wherein performing the setup procedure further includes:
   storing second data of which a true value set is known;
   retrieving the stored second data using the first number of quantisation bins without using soft decoding;
   determining a third probability set associated with the first number quantisation bins based on the true value set and the retrieved second data, and
   determining the first LLR set based on the third probability set.

3. The method as claimed in claim 2, wherein performing the setup procedure further includes:
   determining a fourth probability set associated with a third number of quantisation bins by optimising a quantisation bins number based on the true value set and the retrieved second data, the third number being less than the first number and determining a fourth LLR set associated with the third number of quantisation bins based on the fourth probability set.

4. A non-volatile storage medium storing code for execution by a processor, the code configured to, when executed, cause the processor to perform the method of claim 1.

5. The method as claimed in claim 3, further comprising:
   performing a first normal operation procedure after the set up procedure and before the update procedure including retrieving stored data using soft decoding based on the fourth LLR set; and
   performing a second normal operation procedure after the update procedure including retrieving stored data using soft decoding based on the third LLR set.

6. The method as claimed in claim 5, wherein the update procedure is performed when a number of program and erase cycles in the first normal operation procedure exceeds a threshold.

7. The method as claimed in claim 1, wherein the updating the first LLR set to the second LLR set by iterating the retrieval and the update.

8. A computing device comprising memory for storing data, parameters for use in soft decoding stored data and program instructions, read circuitry for retrieving stored data and a processor, the program instructions configured to cause the processor to:
   performing a setup procedure including storing a first log likelihood ratio (LLR) set associated with a first number of quantisation bins; and
   performing an update procedure including:
   retrieving first data stored in the memory using soft decoding based on the first LLR set;
   determining a first posterior probability set associated with the first number of quantisation bins based on the retrieved first data;
   updating the first LLR set to a second LLR set associated with the first number of quantisation bins based on the first posterior probability set;
   determining a second posterior probability set associated with a second number of quantisation bins based on the first posterior probability set, the second number being less than the first number;
   determining a third LLR set associated with the second number of quantisation bins based on the second posterior probability set; and
   storing the second LLR set and the third LLR set.

9. The computing device as claimed in claim 8, wherein the program code is configured to cause the processor to perform the setup procedure further including:
   storing second data of which a true value set is known;
   retrieving the stored second data using the first number of quantisation bins without using soft decoding;
   determining a third probability set associated with the first number quantisation bins based on the true value set and the retrieved second data, and
   determining the first LLR set based on the third probability set.

10. The computing device as claimed in claim 8, wherein the program code is configured to cause the processor to perform the setup procedure further including:
   determining a fourth probability set associated with a third number of quantisation bins by optimising a quantisation bins number the true value set and the retrieved second data, the third number being less than the first number; and determining a fourth LLR set associated with the third number of quantisation bins based on the fourth probability set.

11. The computing device as claimed in claim 10, wherein the program instructions are further configured to cause the processor to:
   perform a first normal operation procedure after the set up procedure and before the update procedure including retrieving stored data using soft decoding based on the fourth LLR set; and
   perform a second normal operation procedure after the update procedure including retrieving stored data using soft decoding based on the third LLR set.

12. The computing device as claimed in claim 11, wherein the update procedure is performed when a number of program and erase cycles in the first normal operation procedure exceeds a threshold.

13. The computing device as claimed in claim 8, wherein the updating the first LLR set to the second LLR set includes iterating and retrieving the first data using an updated LLR set.

* * * * *